(12) United States Patent
You

(10) Patent No.: US 6,526,549 B1
(45) Date of Patent: Feb. 25, 2003

(54) HIERARCHICAL PARASITIC CAPACITANCE EXTRACTION FOR ULTRA LARGE SCALE INTEGRATED CIRCUITS

(75) Inventor: Eileen H. You, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 169 days.

(21) Appl. No.: 09/662,387

(22) Filed: Sep. 14, 2000

(51) Int. Cl.[7] .................................................. G06F 9/45
(52) U.S. Cl. ..................................... 716/5; 716/4; 716/6
(58) Field of Search ................................ 716/4–10, 12

(56) References Cited

U.S. PATENT DOCUMENTS 5,629,860 A * 5/1997 Jones et al. ..................... 716/6
5,901,063 A * 5/1999 Chang et al. ................... 716/4

OTHER PUBLICATIONS

"Parasitic Extraction for Multimillion–Transistor Integrated Circuits: Methodology and Design Experience" Authors: Eileen You, Swee Choe, Chin Kim, Lakshminarasimh Varadadesikan, Kathirgamar Aingaran and John McDonald of Sun Microsystems, Inc., 901 San Antonio Road, Palo Alto, CA 94303.

"Panel: Parasitic Extraction Accuracy; How Much is Enough?" Chair: Paul Franzon—North Carolina State University, Raleigh, NC Organizer: Mark S. Basel—Cadence Design Systems, Cary, NC.

* cited by examiner

*Primary Examiner*—Vuthe Siek
*Assistant Examiner*—Naum Levin
(74) *Attorney, Agent, or Firm*—Rosenthal & Osha L.L.P.

(57) ABSTRACT

A method for extracting parasitic capacitance from an integrated circuit layout includes decomposing nets in the integrated circuit layout into conductive segments along two mutually perpendicular directions. The method further includes summing capacitances between the conductive segments in a selected net and the other conductive segments in the integrated circuit layout that are aligned with the conductive segments in the selected net and multiplying the sum by a first scaling factor to obtain a first capacitance value. The method further includes summing capacitances between the conductive segments in the selected net and the other conductive segments in the integrated circuit layout that are transverse to the conductive segments in the selected net to obtain a second capacitance value. The first capacitance value and the second capacitance value are added together to obtain a total capacitance value for the selected net.

11 Claims, 4 Drawing Sheets

HIERARCHICAL PARASITIC CAPACITANCE EXTRACTION FOR ULTRA LARGE SCALE INTEGRATED CIRCUITS

BACKGROUND OF THE INVENTION

1. Field of the Invention

The invention relates to methods for modeling electric effects of interconnect parasitics in integrated circuits.

2. Background Art

The design of an integrated circuit occurs in several stages. As illustrated in FIG. 1, the design of the integrated circuit starts with drafting a specification of the intended functions of the integrated circuit (shown at 2). A logic design is then produced and optimized based on the functions described in the specification (shown at 4). For ultra large scale integration (ULSI), i.e., an integrated circuit consisting of millions of transistors, the logic design is described in many levels of abstraction to ensure an orderly and structured design process. Typically, the logic design is expressed as a set of interconnected blocks in a hierarchical structure, each block in the design hierarchy representing pieces of hardware ranging from simple logic gates to complete systems, e.g., microprocessors. A floor plan of the integrated circuit is created from the logic design (shown 6). The floor plan is transferred to a layout design system for placement and routing (shown at 8). "Placement" is the process by which logic elements in the logic design are realized in the circuit elements of a physical implementation, and "routing" is the process by which metal interconnections are created between the circuit elements. After placement and routing, estimates of the parasitic impedances of the metal interconnections are made ("extracted") to form an interconnect delay model (shown at 10). The signal path delays are then calculated using the interconnect delay model, and detailed timing analysis is performed to verify that the delay characteristics of the circuit satisfy specified design criteria (shown at 12). The design process is completed (shown at 14) if the delay characteristics of the circuit satisfy specified design criteria. If the delay characteristics of the circuit do not satisfy specified design criteria, the logic design is refined and the circuit is retested until the delay characteristics of the circuit satisfy the specified design criteria.

In deep submicron process technologies (0.35 µm and below), interconnect delays dominate system performance. Therefore, accurate modeling of the parasitic effects, e.g., parasitic capacitances, associated with the interconnects is very important. The most accurate algorithm for extracting capacitance involves solving Laplace's equation with boundary conditions numerically. See, for example, E. Dengi and R. Rohrer, "Boundary Element Method Macromodels for 2-D Hierarchical Capacitance Extraction," Proc. of the 35$^{th}$ DAC, pp. 218–333, June 1998, W. Shi et al., "A Fast Hierarchical Algorithm for 3-D Capacitance Extraction," Proc. of the 35$^{th}$ DAC, pp. 212–217, June 1998. This approach is, however, very slow and therefore not appropriate for computing the overall capacitance matrix of ULSI layout. Full-chip interconnect models are usually obtained using a layout parameter extraction tool which employs three-dimensional field solutions to create analytical model or lookup table models. These models in conjunction with layout pattern recognition algorithms are applied during run time to determine capacitance values. To ensure the quality of subsequent timing and signal integrity analyses, the extracted parasitic values have to be verified against some known "golden data" which are either results of three-dimensional field solutions or measured parasitic values. See, for example, P. Franzon et al., "Parasitic Extraction Accuracy; How much is enough?" Proc. of the 36$^{th}$ DAC, pp. 429, June 1999. Once an extraction tool is validated, a flat, post-layout extraction is expected to produce reasonably accurate interconnect models.

Interconnect parasitics are not intentionally designed into a chip but rather are consequences of the layout and are usually degrading to the circuit performance. Thus modeling interconnect parasitics early in the design process, i.e., prior to completion of the physical design, is crucial to capturing major timing and noise problems. Initially, values of interconnect parasitics are computed based on a set of wire load models and Manhattan distances of the nets. Later in the design process, most blocks on the chip have either a partial layout view or an abstract view describing areas to be occupied by a certain level of metal. To achieve timing closure, a realistic estimation of the total capacitance for the nets must be determined. The total net capacitance is given by the following expression:

$$C_T = C_G + \sum_i M^i C_C^i \qquad (1)$$

where $M^i$ are Miller scaling factors, usually ranging from 0 to 2, $C_G$ is the capacitance to static nets (ground), and $C_c^i$ are capacitances to switching nets (signal). In order to compute $C_T$, it is necessary to distinguish between switching nets and static nets. Unfortunately, the switching information of every net is not known prior to completion of the physical design. Without switching information, performance analysis (timing, noise, etc.) has to be done under "worst case" assumptions. However, in hierarchical extraction, most extraction tools consider all unspecified nets static by default. As a result, the worst case conditions may not necessarily be captured, leading to significant errors in analysis results.

SUMMARY OF THE INVENTION

In one aspect, the invention relates to a method for extracting parasitic capacitance from an integrated circuit layout which comprises decomposing nets in the integrated circuit layout into conductive segments along two mutually perpendicular directions. The method further includes summing capacitances between the conductive segments in a selected net and the remaining conductive segments in the integrated circuit layout that are aligned with the conductive segments in the selected net and multiplying the sum by a scaling factor to obtain a first capacitance value. The method further includes summing capacitances between the conductive segments in the selected net and the remaining conductive segments in the integrated circuit layout that are transverse, to the conductive segments in the selected net to obtain a second capacitance value. The method further includes summing the first capacitance value and second capacitance value to obtain a total capacitance value for the selected net.

In another aspect, the invention relates to a method for extracting parasitic capacitance from an integrated circuit layout which comprises decomposing nets in the integrated circuit layout into conductive segments along two mutually perpendicular directions. The method further includes summing capacitances between the conductive segments in a selected net and the remaining conductive segments in the integrated circuit layout that are aligned with the conductive segments in the selected net and multiplying the sum by a first scaling factor to obtain a first capacitance value. The method further includes summing capacitances between the conductive segments in the selected net and the remaining conductive segments in the integrated circuit layout that are transverse to the conductive segments in the selected net and multiplying the sum by a second scaling factor to obtain a second capacitance value. The method further includes summing the first capacitance value and second capacitance value to obtain a total capacitance value for the selected net.

Other aspects and advantages of the invention will be apparent from the description which follows and the appended claims.

DETAILED DESCRIPTION OF THE INVENTION

Figure 1:
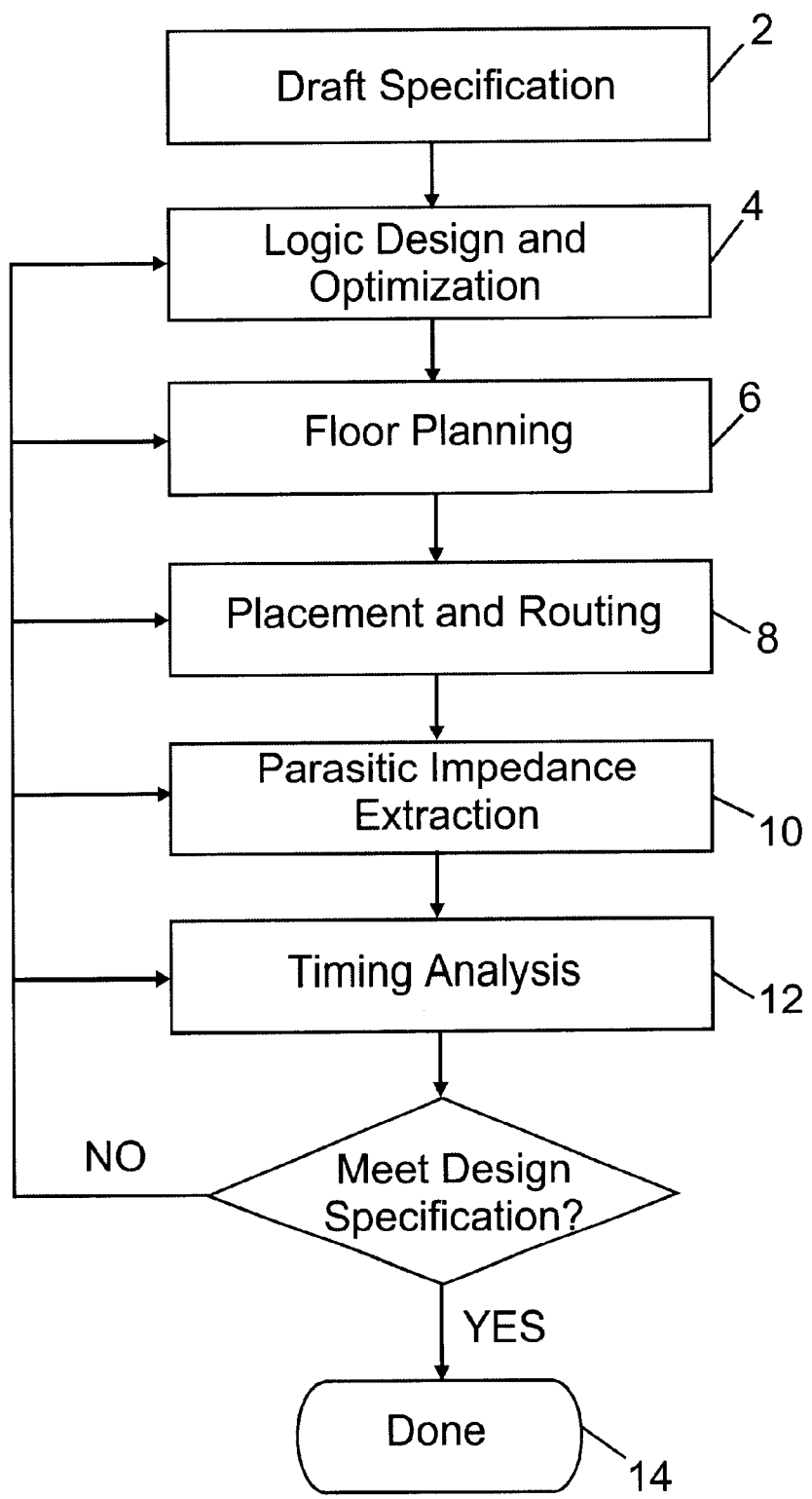
FIG. 1 is a flowchart illustrating a process for designing an integrated circuit.
Figure 2:
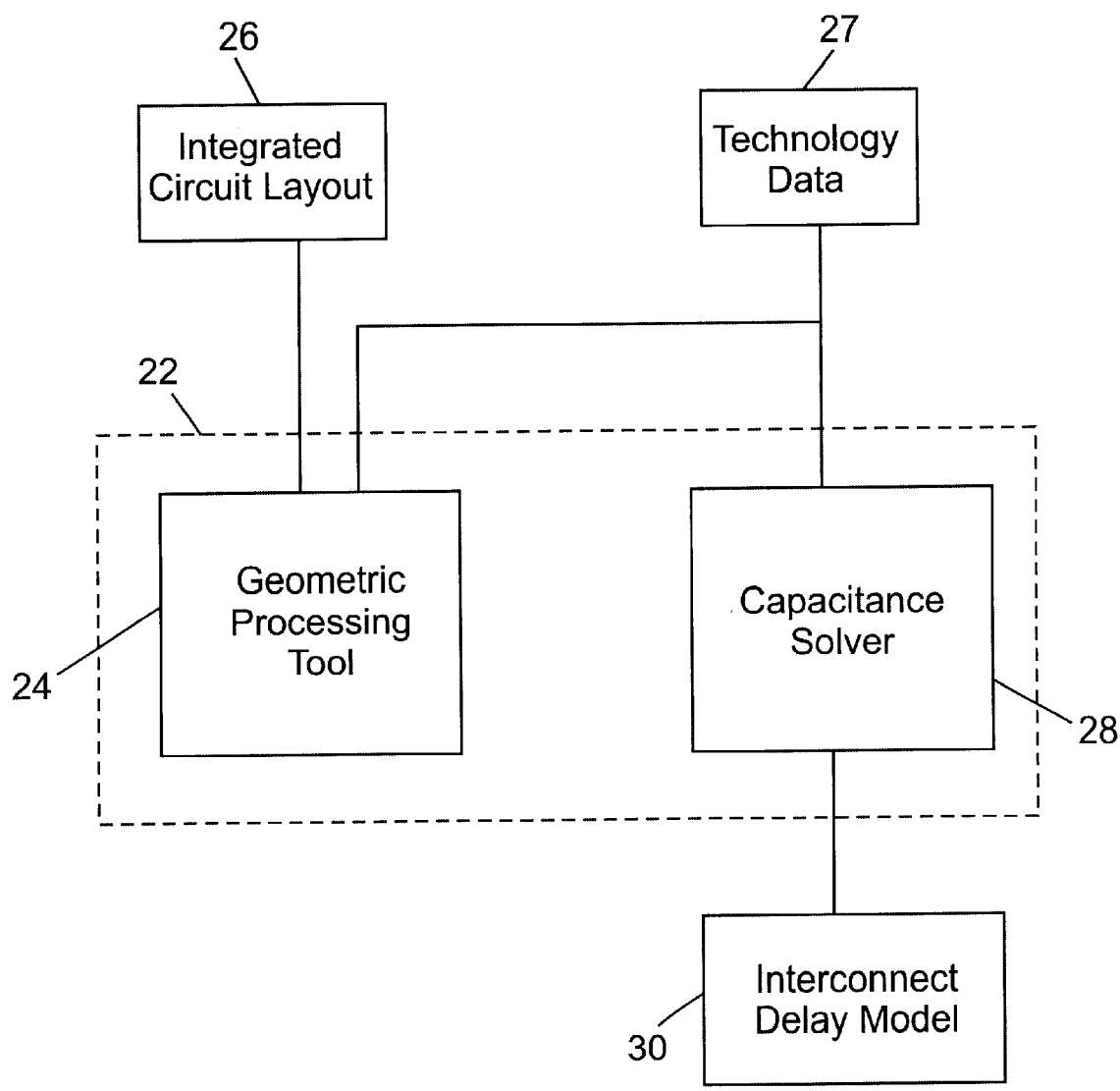
FIG. 2 shows a block diagram of an extraction tool.

Various embodiments of the invention will now be described with reference to the accompanying figures. FIG. 2 shows an extraction tool 22 which comprises a geometry processing tool 24. Typically, the geometry processing tool is a computer-aided design (CAD) engine which receives a geometric file and produces certain parameters based on the information contained in the geometric file. In the invention, the geometry processing tool 24 receives an integrated circuit layout 26 as input. Typically, the layout 26 is in a standard industry format, e.g., GDSII or LEF/DEF. The geometry processing tool 24 analyzes the nets in the layout 26 and generates parameters based on specific regions of the layout 26. Examples of geometry processing tools suitable for use in the invention can be found in Fire & Ice QX extraction tool from Simplex Solutions, Inc., and Star-RC extraction tool from Avant! Corporation. The extraction tool 22 further includes a capacitance solver 28 which extracts capacitances from the layout 26 using the parameters generated by the geometry processing tool 24 and technology data 27. The capacitance solver 28 may be implemented as a set of instructions which are executable by a processor (not shown). The capacitances extracted by the capacitance solver 28 are used in building an interconnect delay model 30 of the circuit.

Figure 3:
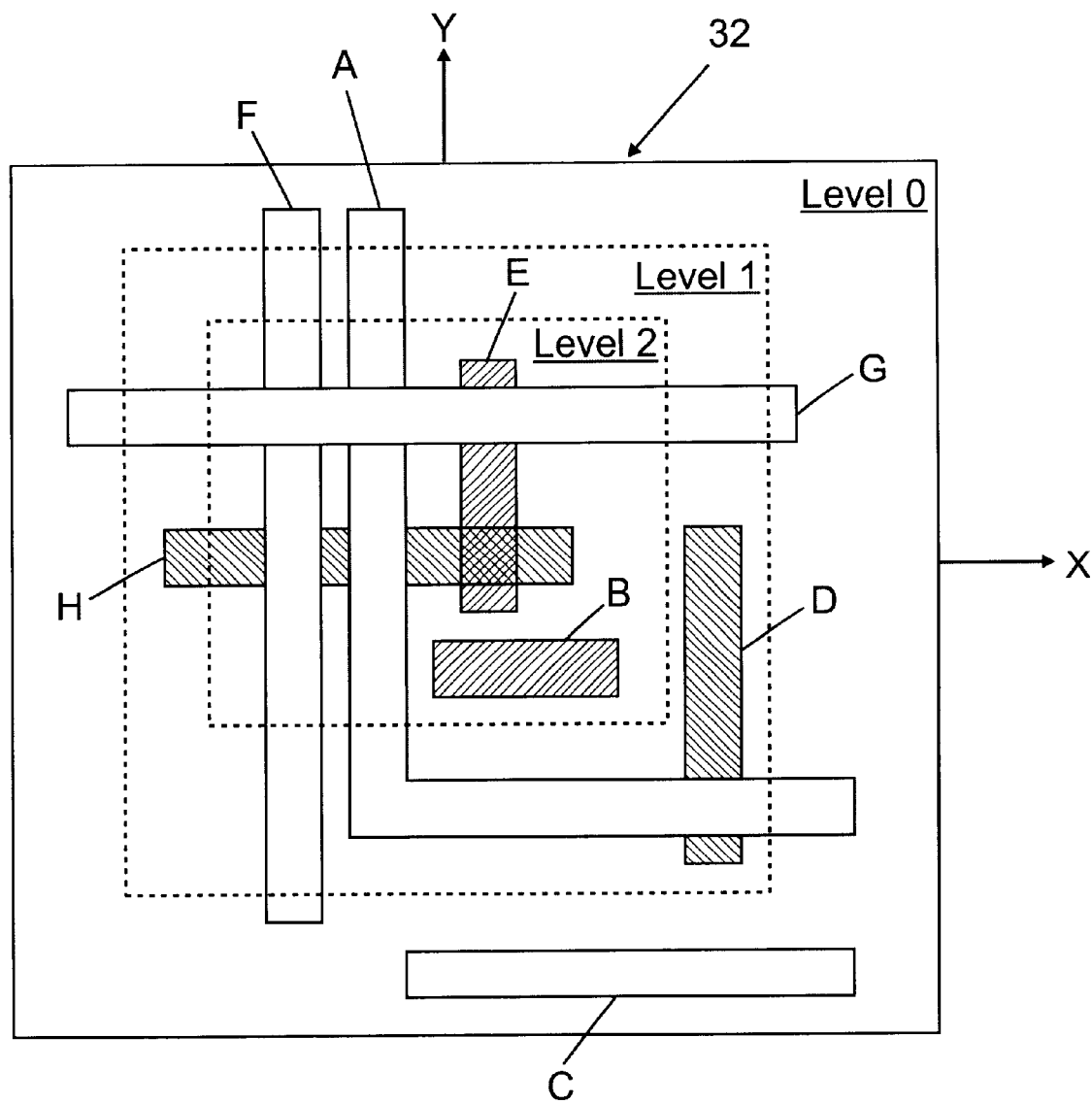
FIG. 3 schematically depicts a hierarchical design of an integrated circuit.
Figure 4:
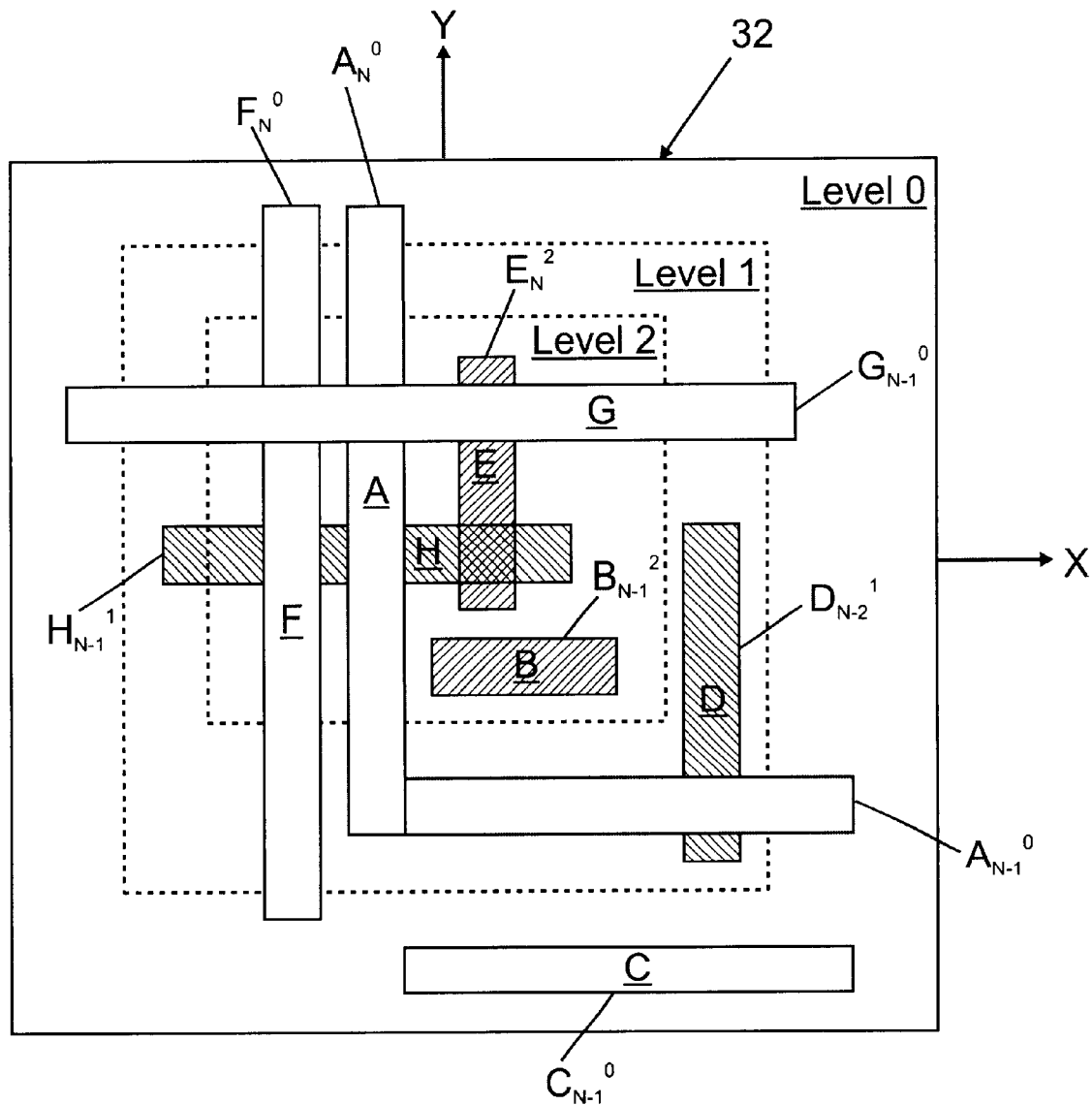
FIG. 4 shows the nets in FIG. 3 divided into conductive segments.

FIG. 3 schematically depicts a hierarchical design of an integrated circuit 32 that may be processed by the extraction tool 22 shown in FIG. 2. It should be noted that the design shown in FIG. 3 is very simple and is intended for illustrative purposes only. The integrated circuit design 32 includes nets A–H, each located on different levels of the design hierarchy. There are three levels in this example, including levels 0, 1, and 2, where level 0 is the top level and level 2 is the bottom level. In reality, there will be many more levels. Nets A, C, F, and G are located at level 0, nets D and H are located at level 1, and nets B and E are located at level 2. The nets A–H are represented by conductor polygons. The conductor polygons can be further decomposed into conductive segments, each conductive segment oriented along one of two mutually perpendicular directions, e.g., the x or y direction. As shown in FIG. 4, net A includes conductive segments $A_N^0$ and $A_{N-1}^0$, where the subscripts N and N-1 represent the conductive layers of the segments and the superscript 0 represents the level number of the conductive segments in the design hierarchy. Similarly, net B includes conductive segment $B_{N-1}^2$, net C includes conductive segment $C_{N-1}^0$, net D includes conductive segment $D_{N-2}^1$, net E includes conductive segment $E_N^2$, net F includes conductive segment $F_N^0$, net G includes conductive segment $G_{N-1}^0$, and net H includes conductive segment $H_{N-1}^1$. In the design hierarchy, conductive segments $F_N^0$, $E_N^2$, $G_{N-1}^0$, and $H_{N-1}^1$ interact with conductive segment $A_N^0$, and conductive segments $B_{N-1}^2$, $C_{N-1}^0$, and $D_{N-2}^1$ interact with conductive segment $A_{N-1}^0$.

The capacitance solver 28 (shown in FIG. 2) uses a hierarchical parasitic capacitance extraction method to extract capacitances from an integrated circuit layout. The hierarchical parasitic capacitance extraction method of the invention will be described first for an arbitrary net N and then applied to a specific net in the integrated circuit design 32 (shown in FIGS. 3 and 4). Suppose that an arbitrary net N can be divided into n conductive segments, each of the n wire segments lying along either one of two mutually perpendicular directions. The total capacitance of the net N is equal to the sum of the conductive segment capacitances, $C_T^n$, $$C_T^n = \sum_j C_G^j + \sum_i M^i C_C^i \qquad (2)$$

$$= \sum_{jS} C_G^{jS} + \sum_{jL} C_G^{jL} + \sum_{iS} M^{iS} C_C^{iS} + \sum_{iL} M^{iL} C_C^{iL}$$

where $M^i$, $M^{iS}$, and $M^{iL}$ are Miller scaling factors, $C_G^{jS}$ and $C_C^{iS}$ are capacitances to static nets and switching nets, respectively, in the same hierarchical level as wire segment n, and $C_G^{jL}$ and $C_C^{jL}$ are capacitances to static and switching nets, respectively, at other hierarchical levels. While it is straightforward to extract $C_G^{jS}$ and $C_C^{iS}$ extracting $C_G^{jL}$ and $C_C^{jL}$ may be challenging because switching characteristics of every net at hierarchical levels other than the hierarchical level of net N are often unknown prior to completion of the physical design. Not being able to separate $C_G^{jL}$ from $C_C^{jL}$, i.e., not being able to distinguish between static and switching nets at other hierarchical levels, introduces significant uncertainty in the extracted net capacitance values.

Returning to equation (2), if a global Miller scaling factor M is applied to all the capacitances to switching nets (also known as coupling capacitances), $C_c$, equation (2) can be expanded into $$C_T^n = \sum_{jSP} C_G^{jSP} + \sum_{jST} C_G^{jST} + \sum_{jLP} C_G^{jLP} + \sum_{jLT} C_G^{jLT} + \qquad (3)$$

$$M\left(\sum_{iSP} C_C^{iSP} + \sum_{iST} C_C^{iST} + \sum_{iLP} C_C^{iLP} + \sum_{iLT} C_C^{iLT}\right)$$

where $C_G^{jSP}$ and $C_C^{iSP}$ are capacitances between the conductive segment n and static and switching conductor polygons, respectively, parallel to and on the same hierarchical level as the conductive segment n, $C_G^{jLP}$ and $C_C^{iLP}$ are capacitances between the conductive segment n and static and switching conductor polygons, respectively, parallel to and on a different hierarchical level than the conductive segment n, $C_G^{jST}$ and $C_C^{iST}$ are capacitances between the conductive segment n and static and switching conductor polygons, respectively, transverse to and on the same hierarchical level as the conductive segment n, $C_G^{jLT}$ and $C_C^{iLT}$ are capacitances between the conductive segment n and static and switching conductor polygons, respectively, transverse to and on a different hierarchical level than the conductive segment n. If switching characteristics of every net are not known, by default most traditional extraction tools assume that all unspecified nets are static. The estimated total capacitance value based on this assumption is therefore $$\tilde{C}_T^n = \sum_{jSP} C_G^{jSP} + \sum_{jST} C_G^{jST} + \sum_{jLP} C_G^{jLP} + \sum_{jLT} C_G^{jLT} + \quad (4)$$

$$M \sum_{iSP} C_C^{jSP} + M \sum_{iST} C_C^{jST} + \sum_{iLP} C_C^{iLP} + \sum_{iLT} C_C^{iLT}$$

It is straightforward to prove that $\tilde{C}_T^n - C_T^n \leq 0$ for setup time analysis ($M \approx 2$), and $\tilde{C}_T^n - C_T^n \geq 0$ for hold time analysis ($M \approx 0$). In either case, capacitance values extracted based on equation (4) generally leads to optimistic timing results.

In the invention, a more reliable prediction of capacitance values is achieved by taking advantage of the fact that lateral coupling capacitance is the dominant factor in deep submicron circuits. Thus, if all conductor polygons that are parallel to conductive segment n are treated as switching and all conductor polygons that are transverse to conductive segment n are considered static, the segment capacitance value is $$\hat{C}_T^n = M \sum_{jSP} C_G^{jSP} + \sum_{jST} C_G^{jST} + M \sum_{jLP} C_G^{jLP} + \sum_{jLT} C_G^{jLT} + \quad (5)$$

$$M \sum_{iSP} C_C^{jSP} + \sum_{iST} C_C^{jST} + M \sum_{iLP} C_C^{iLP} + \sum_{iLT} C_C^{iLT}$$

where $C_G^{jSP}$ and $C_C^{iSP}$ are capacitances between the conductive segment n and conductor polygons parallel to and on the same hierarchical level as the conductive segment n, $C_G^{jLP}$ and $C_C^{iLP}$ are capacitances between the conductive segment n and conductor polygons parallel to and on a different hierarchical level than the conductive segment n, $C_G^{jST}$ and $C_C^{iST}$ are capacitances between the conductive segment n and conductor polygons transverse to and on the same hierarchical level as the conductive segment n, and $C_G^{jLT}$ and $C_C^{iLT}$ are capacitances between the conductive segment n and conductor polygons transverse to and on a different hierarchical level than the conductive segment n.

It should be noted that equation (5) does not depend on switching information to compute capacitance value, only information about the orientation of the conductor polygons with respect to the conductive segment n is needed. For nets in densely routed areas, the most significant portion of the net capacitance can be attributed to lateral coupling capacitances. In this case equation (5) yields conservative estimation of parasitic capacitances for timing analysis, i.e., $\hat{C}_T^n - C_T^n \geq 0$ for setup time analysis ($M \approx 2$) and $\hat{C}_T^n - C_T^n \leq 0$ for hold time analysis ($M \approx 0$). Because the routing direction on each conductive layer is predetermined, the approach above can be implemented by dynamically applying the Miller scaling factor M to the capacitance models according to the routing directions involved.

Equation (5) assumes that switching of the transverse nets is not strongly correlated. In other words, equation (5) essentially assumes that all the transverse conductor polygons above and below net N form pseudo-static reference grids. This yields capacitance values with a reasonable guard band but are not overly pessimistic. If the switching of the transverse nets is strongly correlated, then equation (5) can be modified as $$\hat{C}_T^n = M \sum_{jSP} C_G^{jSP} + M \sum_{jST} C_G^{jST} + M \sum_{jLP} C_G^{jLP} + M \sum_{jLT} C_G^{jLT} + \quad (6)$$

$$M \sum_{iSP} C_C^{jSP} + M \sum_{iST} C_C^{jST} + M \sum_{iLP} C_C^{iLP} + M \sum_{iLT} C_C^{iLT}$$

to provide a conservative capacitance estimation.

The following illustrates how the principles of the invention are applied to the net A in the integrated circuit design 32 shown in FIGS. 3 and 4. As shown in FIG. 4, net A has a wire segment $A_N^0$ along the y direction and a wire segment $A_{N-1}^0$ along the x direction. Table 1 shows a summary of the other nets in the design hierarchy of FIG. 3 and their relationship to net A.

TABLE 1

Summary of Nets in the Design hierarchy of FIGS. 3 and 4

| Nets | Same Hierarchical Level as Net A | Orientation to $A_N^0$ | Orientation to $A_{N-1}^0$ |
|---|---|---|---|
| $B_{N-1}^2$ | No | Transverse | Parallel |
| $C_{N-1}^0$ | Yes | Transverse | Parallel |
| $D_{N-2}^1$ | No | Parallel | Transverse |
| $E_N^2$ | No | Parellel | Transverse |
| $F_N^0$ | Yes | Parallel | Transverse |
| $G_{N-1}^0$ | Yes | Transverse | Parallel |
| $H_{N-1}^1$ | No | Transverse | Parellel |

Assume for illustration purposes that the conductor polygons $C_{N-1}^0$ and $D_{N-2}^1$ are static, then the capacitance elements for net A are as shown in Table 2 below.

TABLE 2

Capacitance Elements for Net A

| Capacitance Element | Capacitance |
|---|---|
| $C_G^{SP}$ | $C(A_{N-1}^0, C_{N-1}^0)$ |
| $C_G^{ST}$ | 0 |
| $C_G^{LP}$ | $C(A_N^0, D_{N-2}^1)$ |
| $C_G^{LT}$ | $C(A_{N-1}^0, D_{N-2}^1)$ |
| $C_C^{SP}$ | $C(A_N^0, F_N^0) + C(A_{N-1}^0, G_{N-1}^0)$ |
| $C_C^{ST}$ | $C(A_N^0, G_{N-1}^0)$ |
| $C_C^{LP}$ | $C(A_N^0, E_N^2) + C(A_{N-1}^0, B_{N-1}^2) + C(A_{N-1}^0, H_{N-1}^1)$ |
| $C_C^{LT}$ | $C(A_N^0, H_{N-1}^1)$ |

It should be noted that capacitances between transverse polygons that are on different metal layers are not included in Table 2.

Returning to FIG. 4, some of the conductor polygons $B_{N-1}^2$, $C_{N-1}^0$, $D_{N-2}^1$, $E_N^2$, $F_N^0$, $G_{N-1}^0$, and $H_{N-1}^1$ are too far from the conductive segments $A_N^0$ and $A_{N-1}^0$ to contribute significantly to the overall capacitance value of net A. For example, the capacitance between $A_N^0$ and $D_{N-2}^1$ i.e., $C(A_N^0, D_{N-2}^1)$, can be approximated to zero because the horizontal distance between $A_N^0$ and $D_{N-2}^1$ exceeds a selected threshold distance. In addition, $A_N^0$ and $D_{N-2}^1$, are on different metal layers. Similarly, the capacitances $C(A_{N-1}^0, G_{N-1}^1)$ and $C(A_{N-1}^0, H_{N-1}^1)$ can be approximated to zero because $G_{N-1}^0$ and $H_{N-1}^1$, respectively, are far from the wire segment $A_{N-1}^0$. In general, a threshold distance is selected which will be used to determine when two nets are far apart enough that the capacitance between them can be approximated to zero. Table 3 shows the capacitance elements for net A if $C(A_N^0, D_{N-2}^1)$, $C(A_{N-1}^0, G_{N-1}^0)$, and $C(A_{N-1}^0, H_{N-1}^1)$, are approximated to zero.

TABLE 3

Capacitance Elements for Net A

| Capacitance Element | Capacitance |
|---|---|
| $C^{SP}_G$ | $C(A^0_{N-1}, C^0_{N-1})$ |
| $C^{ST}_G$ | 0 |
| $C^{LP}_G$ | 0 |
| $C^{LT}_G$ | $C(A^0_{N-1}, D^1_{N-2})$ |
| $C^{SP}_C$ | $C(A^0_N, F^0_N)$ |
| $C^{ST}_C$ | $C(A^0_N, G^0_{N-1})$ |
| $C^{LP}_C$ | $C(A^0_N, E^2_N) + C(A^0_{N-1}, B^2_{N-1})$ |
| $C^{LT}_C$ | $C(A^0_N, H^1_{N-1})$ |

Using equation (3) and the capacitance elements in Table 3, the correct total capacitance value for net A is:

$$C_A = C(A^0_{N-1}, C^0_{N-1}) + C(A^0_{N-1}, D^1_{N-2}) + \qquad (7)$$
$$M \times C(A^0_N, F^0_N) + M \times C(A^0_N, G^0_{N-1}) +$$
$$M \times [C(A^0_{N-1}, B^2_{N-1}) + C(A^0_N, E^2_N)] + M \times C(A^0_N, H^1_{N-1})$$

Using traditional methods, i.e., equation (4), the estimated total capacitance value is:

$$\tilde{C}_A = C(A^0_{N-1}, C^0_{N-1}) + C(A^0_{N-1}, D^1_{N-2}) + \qquad (8)$$
$$M \times C(A^0_N, F^0_N) + M \times C(A^0_N, G^0_{N-1}) +$$
$$C(A^0_{N-1}, B^2_{N-1}) + C(A^0_N, E^2_N) + M \times C(A^0_N, H^1_{N-1})$$

The difference between the estimated capacitance using equation (4) and the correct total capacitance using equation (2) is then $$\tilde{C}_A - C_A = \qquad (9)$$
$$(1-M) \times C(A^0_{N-1}, B^2_{N-1}) + C(A^0_N, E^2_N) + (1-M) \times C(A^0_N, H^1_{N-1})$$

where M typically ranges from 0 to 2. For M greater than 1, the first and third terms in equation (9) are negative. If the sum of the absolute values of the first and third terms is equal to or greater than the second term, then $\tilde{C}_A - C_A \leq 0$. However, for conservative estimation of parasitic capacitances, it is desirable that $\tilde{C}_A - C_A \geq 0$ for M approximately equal to 2. For M less than 1, $\tilde{C}_A - C_A \geq 0$. However, for conservative estimation of parasitic capacitances, it is desirable that $\tilde{C}_A - C_A \leq 0$ for M approximately equal to 0. Thus as previously noted, the estimated value using the traditional approach in equation (4) is usually too optimistic.

A more conservative estimate of parasitic capacitances can be obtained using equation (5) or (6) of the present invention. Using equation (5), the overall capacitance for net A is $$\hat{C}_A = M \times C(A^0_{N-1}, C^0_{N-1}) + \qquad (10)$$
$$C(A^0_{N-1}, D^1_{N-2}) + M \times C(A^0_N, F^0_N) + C(A^0_N, G^0_{N-1}) +$$
$$M \times [C(A^0_{N-1}, B^2_{N-1}) + C(A^0_N, E^2_N)] + C(A^0_N, H^1_{N-1})$$

The difference between the estimated capacitance using equation (5) and the correct total capacitance using equation (2) is then $$\hat{C}_A - C_A = (M-1) \times C(A^0_{N-1}, C^0_{N-1}) + \qquad (11)$$
$$(1-M) \times C(A^0_N, G^0_{N-1}) + (1-M) \times C(A^0_N, H^1_{N-1})$$

When M is approximately 0, the second and third terms are positive and the first term is negative. If the absolute value of the first term is greater than the sum of the second and third terms, then $\hat{C}_A - C_A \leq 0$. When M is approximately 2, the first term is positive and the second and third terms are negative. If the first term is greater than the sum of the absolute values of the second and third terms, then $\hat{C}_A - C_A \geq 0$. In deep submicron design, equation (11) is most/likely to be on the conservative side because lateral coupling capacitance is dominant, i.e., $C(A_{N-1}{}^0, C_{N-1}{}^0) >> C(A_N{}^0, G_{N-1}{}^0)$ and $C(A_{N-1}{}^0, C_{N-1}{}^0) >> C(A_N{}^0, H_{N-1}{}^1)$.

In operation, and with reference to FIG. 2, the geometry processing tool 24 receives the integrated circuit layout 26 and analyzes the nets in the layout 26. For each net of interest N in the integrated circuit layout 26, the geometry processing tool 24 identifies the nets within a predetermined distance of the net of interest N. The geometry processing tool 24 further identifies the conductor polygons that are parallel or perpendicular to the conductive segments of the net of interest N. The information about these conductor polygons are then transferred to the capacitance solver 28. The capacitance solver 28 extracts the capacitance for the net of interest N using equation (5) or equation (6) and the orientation of the conductor polygons, as demonstrated for the net A above. The capacitances between the conductive segments of the net of interest N and the conduction polygons are obtained from the technology data 27. The capacitance extraction process can be repeated for all the nets in the integrated circuit layout to generate a capacitance matrix for the integrated circuit.

The hierarchical parasitic capacitance extraction method of the invention is advantageous because it reduces the gap between the parasitic values estimated based on a partial layout of an integrated circuit and the results of post-layout extraction. As previously mentioned, for integrated circuits with multimillion transistors, timing analysis has to be performed continually through the design cycle to ensure that the circuit that is being constructed meets specified design criteria. To perform the timing analysis, it is necessary to determine the total capacitance of all the nets in the integrated circuit layout. To compute the correct total capacitance of all the nets, one needs to be able to distinguish between switching nets and static nets. However, until the physical design of the integrated circuit is completed, the switching information of every net in the integrated circuit is not known. Advantageously, the parasitic extraction methodology of the present invention is based on routing directions instead of the incomplete switching information. Thus, realistic parasitic capacitance estimates can be obtained at any stage of the design process. At later stages of the design process, more layout information is available, allowing the interconnect model to be refined. The advantage of the present invention over the traditional extraction method becomes more evident as wire width and space shrink.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for extracting parasitic capacitance from an integrated circuit layout, comprising:

decomposing nets in the integrated circuit layout into conductive segments along two mutually perpendicular directions;

summing capacitances between the conductive segments in a selected net and the other conductive segments that are aligned with the conductive segments in the selected net and multiplying the sum by a scaling factor to obtain a first capacitance value;

summing capacitances between the conductive segments in the selected net and the other conductive segments that are transverse to the conductive segments in the selected net to obtain a second capacitance value; and summing the first capacitance value and second capacitance value to obtain a total capacitance value for the selected net.

2. The method of claim 1, wherein summing capacitances between the conductive segments in the selected net and the other conductive segments includes identifying the conductive segments within a selected distance from the selected net.

3. The method of claim 2, wherein summing capacitances between the conductive segments in the selected net and the other conductive segments includes approximating the capacitances between the conductive segments in the selected net and the other conductive segments outside of the selected distance to zero.

4. The method of claim 1, wherein the scaling factor is a Miller scaling factor ranging from 0 to 2.

5. A method for extracting parasitic capacitance from an integrated circuit layout, comprising:

decomposing nets in the integrated circuit layout into conductive segments along two mutually perpendicular directions;

summing capacitances between the conductive segments in the selected net and the other conductive segments that are aligned with the conductive segments in the selected net and multiplying the sum by a first scaling factor to obtain a first capacitance value;

summing capacitances between the conductive segments in the selected net and the other conductive segments that are transverse to the conductive segments in the selected net and multiplying the sum by a second scaling factor to obtain a second capacitance value; and summing the first capacitance value and second capacitance value to obtain a total capacitance value for the selected net.

6. The method of claim 5, wherein summing capacitances between the conductive segments in the selected net and the other conductive segments includes identifying the conductive segments within a selected distance from the selected net.

7. The method of claim 6, wherein summing capacitances between the conductive segments in the selected net and the other conductive segments includes approximating the capacitances between the conductive segments in the selected net and the other conductive segments outside of the selected distance to zero.

8. The method of claim 5, wherein the first and second scaling factors are Miller scaling factor ranging from 0 to 2.

9. An extraction tool for an integrated circuit layout, comprising:

a geometric processing engine which receives the integrated circuit layout and decomposes nets in the integrated circuit layout into conductive segments along two mutually perpendicular directions; and a capacitance solver which computes the capacitance of a selected net in the integrated circuit based on the orientation of the conductive segments in the selected net with respect to the other conductive segments in the integrated circuit layout.

10. The extraction tool of claim 9, wherein the capacitance solver includes a computer-readable medium having stored thereon instructions which are executable by a processor, the instructions for:

summing capacitances between the conductive segments in the selected net and the other conductive segments that are aligned with the conductive segments in the selected net and multiplying the sum by a scaling factor to obtain a first capacitance value;

summing capacitances between the conductive segments in the selected net and the other conductive segments that are transverse to the conductive segments in the selected net to obtain a second capacitance value; and summing the first capacitance value and second capacitance value to obtain a total capacitance value for the selected net.

11. The extraction tool of claim 9, wherein the capacitance solver includes a computer-readable medium having stored thereon instructions which are executable by a processor, the instructions for:

summing capacitances between the conductive segments in the selected net and the other conductive segments that are aligned with the conductive segments in the selected net and multiplying the sum by a first scaling factor to obtain a first capacitance value;

summing capacitances between the conductive segments in the selected net and the other conductive segments that are transverse to the conductive segments in the selected net and multiplying the sum by a second scaling factor to obtain a second capacitance value; and summing the first capacitance value and second capacitance value to obtain a total capacitance value for the selected net.

* * * * *